United States Patent
Godfried et al.

(10) Patent No.: US 11,569,628 B2
(45) Date of Patent: Jan. 31, 2023

(54) PULSE STRETCHER AND METHOD

(71) Applicant: ASML Netherlands B. V., Veldhoven (NL)

(72) Inventors: Herman Philip Godfried, Amsterdam (NL); Wilhelmus Patrick Elisabeth Maria Op 'T Root, Nederweert (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/268,778

(22) PCT Filed: Aug. 5, 2019

(86) PCT No.: PCT/EP2019/071014
§ 371 (c)(1),
(2) Date: Feb. 16, 2021

(87) PCT Pub. No.: WO2020/038707
PCT Pub. Date: Feb. 27, 2020

(65) Prior Publication Data
US 2021/0344157 A1 Nov. 4, 2021

(30) Foreign Application Priority Data
Aug. 22, 2018 (EP) ..................................... 18190141

(51) Int. Cl.
*G03F 7/20* (2006.01)
*H01S 3/00* (2006.01)
(Continued)

(52) U.S. Cl.
CPC .......... *H01S 3/0057* (2013.01); *G02B 27/144* (2013.01); *G02F 1/0102* (2013.01);
(Continued)

(58) Field of Classification Search
CPC ..... H01S 3/0057; G02B 27/144; G02B 27/48; G02F 1/0102; G02F 2203/50; G03F 7/7015; G03F 7/70583; G03F 7/70041
See application file for complete search history.

(56) References Cited

U.S. PATENT DOCUMENTS 6,191,887 B1   2/2001   Michaloski et al.
6,952,253 B2   10/2005   Lof et al.
(Continued)

FOREIGN PATENT DOCUMENTS

| JP | 2008-522421 A | 6/2008 |
| KR | 1020090022421 A | 3/2009 |
| WO | WO 2018/138819 A1 | 8/2018 |

OTHER PUBLICATIONS

International Search Report and Written Opinion of the International Searching Authority directed to related International Patent Application No. PCT/EP2019/071014, dated Oct. 31, 2019; 11 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

An apparatus (10) for increasing a pulse length of a pulsed radiation beam, the apparatus comprising: a beam splitter (16) configured to split an input radiation beam (18) into a first beam (24) and a second beam (22); an optical arrangement (12, 14), wherein the beam splitter and the optical arrangement are configured such that at least a portion of the first beam is recombined with the second beam into a modified beam after an optical delay of the first beam caused by the optical arrangement; and at least one optical element (30) in an optical path of the first beam, the at least one optical element configured such that the phase of different
(Continued)

parts of a wavefront of the first beam is varied to reduce coherence between the first beam and the second beam.

13 Claims, 8 Drawing Sheets

(51) Int. Cl.
 *G02B 27/14* (2006.01)
 *G02F 1/01* (2006.01)
(52) U.S. Cl.
 CPC ........ *G03F 7/7015* (2013.01); *G03F 7/70583* (2013.01); *G02F 2203/50* (2013.01); *G03F 7/70041* (2013.01)

(56) References Cited

U.S. PATENT DOCUMENTS

| 7,995,280 | B2 | 8/2011 | Kuss et al. | |
|---|---|---|---|---|
| 11,025,026 | B2 | 6/2021 | Onose | |
| 2004/0136417 | A1 | 7/2004 | Webb et al. | |
| 2007/0206381 | A1* | 9/2007 | Fiolka | G03F 7/70058 362/268 |
| 2008/0225921 | A1 | 9/2008 | Kuss et al. | |
| 2010/0302522 | A1 | 12/2010 | Venkataraman et al. | |
| 2011/0255173 | A1* | 10/2011 | Joobeur | G02B 27/145 359/629 |
| 2018/0203248 | A1* | 7/2018 | op 't Root | G03F 7/70041 |
| 2019/0288472 | A1 | 9/2019 | Onose | |

OTHER PUBLICATIONS

Semiconductor Processing Equipment, Research Disclosure No. 652048, Jul. 17, 2018; 4 pages.

Partlo et al., "Reducing coherence in a fifth-harmonic YAG source (213 nm) for use in microlithography," Journal of Vacuum Science & Technology B: Microelectronics and Nanometer Structures Processing, Measurement, and Phenomena, vol. 9, No. 6, Nov. 1991; pp. 3126-3131.

* cited by examiner

PULSE STRETCHER AND METHOD

CROSS-REFERENCE TO RELATED APPLICATIONS

This application claims priority of EP application 18190141.4 which was filed on 22 Aug. 2018 and which is incorporated herein in its entirety by reference.

FIELD

The present invention relates to a pulse stretcher, a lithographic apparatus and related methods.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Pulse stretching devices (pulse stretchers) have been used in lithography to reduce radiation-induced optical damage to components of the optical column (primarily the projection lens but in some cases also the illuminator) and thus improve the lifetime of (the components of) the optical column. A pulse stretcher increases the temporal pulse length of a laser by creating copies of a laser pulse and separating them in time by an optical delay.

An additional benefit of pulse stretchers is a reduction of so-called speckle. Speckle is the optical interference between radiation beams due to temporal and spatial coherence. For deep ultraviolet (DUV) lithography, the radiation (light) source may be an excimer laser. Speckle, through interference of light originating from different parts of the beam, leads to local variations in intensity on the wafer, i.e., local dose variations. The varying dose leads to local critical dimension (CD) variations as determined by the sensitivity of the resist used in the lithography process.

Typical dimensions of speckles for DUV range from about 100 nm (as determined by the optical limits of resolution of the lithography system) up to the sub-millimetre range. Speckle is an essentially stochastic phenomenon and so every instance of a speckle pattern is unique and non-predictive of the next speckle pattern seen on, for example, another wafer. Speckle therefore gives rise to local critical dimension uniformity issues and local CD variations may translate directly into local overlay issues. Thus, it is desirable to reduce the effects of speckle.

SUMMARY

According to a first aspect of the present invention, there is provided an apparatus for increasing a pulse length of a pulsed radiation beam, the apparatus comprising: a beam splitter configured to split an input radiation beam into a first beam and a second beam; an optical arrangement, wherein the beam splitter and the optical arrangement are configured such that at least a portion of the first beam is recombined with the second beam into a modified beam after an optical delay of the first beam caused by the optical arrangement; and at least one optical element in an optical path of the first beam, the at least one optical element configured such that the phase of different parts of a wavefront of the first beam is varied to reduce coherence between the first beam and the second beam.

This has an advantage that it provides a reduction, or further reduction, in speckle in an outgoing radiation beam. The outgoing radiation beam is a combination of the first beam and the second beam. The reduction in speckle may provide better critical dimension uniformity (CDU) and overlay which leads to better yield of substrates in a lithography process.

The coherence that is varied between the first and second beam may be spatial coherence.

The at least one optical element may comprise phase regions across a surface of the at least one optical element. The phase regions may be configured to provide the phase variation to the different parts of the wavefront of the first beam.

The phase regions may have heights that vary across the surface of the at least one optical element to provide the phase variation to the different parts of the wavefront of the first beam. The varying heights of the phase regions may occur in two dimensions across the surface of the at least one optical element. Herewith, varying the coherence in at least two dimensions.

The at least one optical element may have a varying thickness across its surface to define the phase regions. Coherence variation occurs by difference in optical path length of each phase region for the first beam.

The phase regions may be configured to provide random phase variation.

The phase regions may have a shape of one of regular polygon, irregular polygon, triangle, pentagon, square, round, rectangular, and elliptical.

Each of the beams that have been delayed with respect to the input beam (or parent beam) by the optical arrangement before being recombined with the second beam may be referred as child beams.

The at least one optical element may be configured such that the pitch of the at least one optical element is less than the spatial coherence length of the input radiation beam. Herewith, forming coherence cells of regions in space where the phase of the electric field at each point in the region has a fixed, definite relationship with the phase of the field at any other point in the region. This may have an advantage that each coherence cell of the child beams are divided up into parts which do not completely constructively or destructively interfere and thus leads to a reduction in speckle contrast.

The at least one optical element may be configured such that the pitch of the at least one optical element is non-commensurate with the spatial coherence length of the input radiation beam.

The at least one optical element may be configured such that the angle at which the radiation is diffracted from the at least one optical element is less than a fraction of the acceptance angle of the radiation in an optical column, the fraction being the reciprocal of the number of first beams that substantially contribute to the transmitted intensity of the modified beam.

The at least one optical element may be configured such that the phase regions are actively modifiable to change the phase variation to the different parts of the wavefront of the first beam.

The at least one optical element may be a transmissive optical element which may be configured such that the phase of the different parts of the wavefront of the first beam is varied after transmission through the transmissive optical element.

The transmissive optical element may be a phase plate located in the optical path of the first beam. This may have an advantage that the phase plate may be tuned to primarily give diffraction in the $0^{th}$ order, and thus lead to a reduction in optical losses.

The transmissive optical element may be a diffuser located in the optical path of the first beam.

The at least one optical element may be a reflective optical element which is configured such that the phase of the different parts of the wavefront of the first beam is varied after reflection from the reflective optical element.

The reflective optical element may be configured such that the phase of the different parts of the wavefront of the first beam is randomly or quasi-randomly varied after reflection from the reflective optical element.

The reflective optical element may be at least one of a random phase plate reflecting surface and a random diffuser reflecting surface.

The beam splitter may comprise the reflective optical element. This may have an advantage of reducing the number of optical components which leads to lower optical losses and lower cost.

The reflective optical element may be configured such that the phase of different parts of a wavefront of the second beam is varied.

The optical arrangement may comprise at least a mirror, wherein the mirror comprises the reflective optical element. This may have an advantage of reducing the number of optical components which leads to lower optical losses and lower cost.

The optical arrangement may be a con-focal resonator including a first con-focal mirror and a second con-focal mirror.

The apparatus may be located in or at the exit of at least one of a laser, an excimer laser, a solid state laser, a solid state oscillator, a master oscillator, a power amplifier, a master oscillator power amplifier, a power oscillator, a master oscillator power oscillator, and a hybrid laser.

The apparatus may be located between at least one of the master oscillator and the power amplifier, the master oscillator and the power oscillator, the solid state oscillator and the power amplifier, and the solid state oscillator and the power oscillator.

The transmissive optical element may comprise an electrooptic material or a magnetooptical material that alters the optical path length in responds to an applied electric or magnetic field, respectively. Herewith changing the wavefront of the first beam.

According to a second aspect of the present invention, there is provided a lithographic apparatus comprising the apparatus as described above.

The apparatus may be located in a beam delivery system of the lithographic apparatus.

The lithographic apparatus may further comprise: an illumination system configured to condition a radiation beam; a support structure constructed to support a patterning device, the patterning device being capable of imparting the radiation beam with a pattern in its cross-section to form a patterned radiation beam; a substrate table constructed to hold a substrate; and a projection system configured to project the patterned radiation beam onto the substrate.

According to a third aspect of the present invention, there is provided a method for increasing a pulse length of a pulsed radiation beam using an apparatus, the method comprising passing an input radiation beam through a beam splitter of the apparatus to split the input radiation beam into a first beam and a second beam; passing the first beam through an optical arrangement of the apparatus, wherein the beam splitter and the optical arrangement are configured such that at least a portion of the first beam is recombined with the second beam into a modified beam after an optical delay of the first beam caused by the optical arrangement; and varying the phase of different parts of a wavefront of the first beam using at least one optical element in an optical path of the first beam to reduce coherence between the first beam and the second beam.

The at least one optical element may comprise phase regions across a surface of the at least one optical element, the phase regions may be configured to provide the phase variation to the different parts of the wavefront of the first beam.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
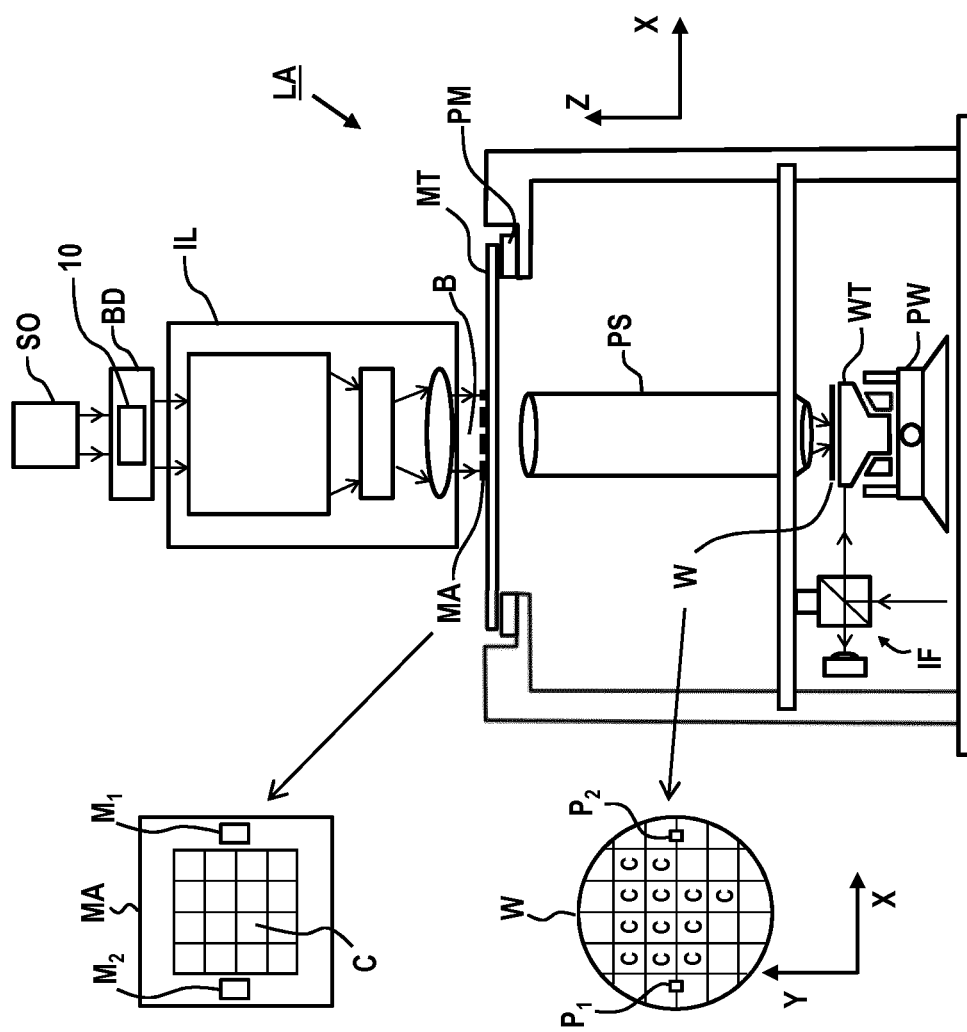
FIG. 1 depicts a schematic overview of a lithographic apparatus according to an embodiment of the invention.

FIG. 1 schematically depicts a lithographic apparatus LA. The lithographic apparatus LA includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g., via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

The beam delivery system BD comprises a pulse stretcher 10 configured to increase a pulse length of the radiation beam B, which may be a pulsed radiation beam. In other embodiments, the pulse stretcher 10 may be located in a different position in the lithographic apparatus LA.

Figure 2:
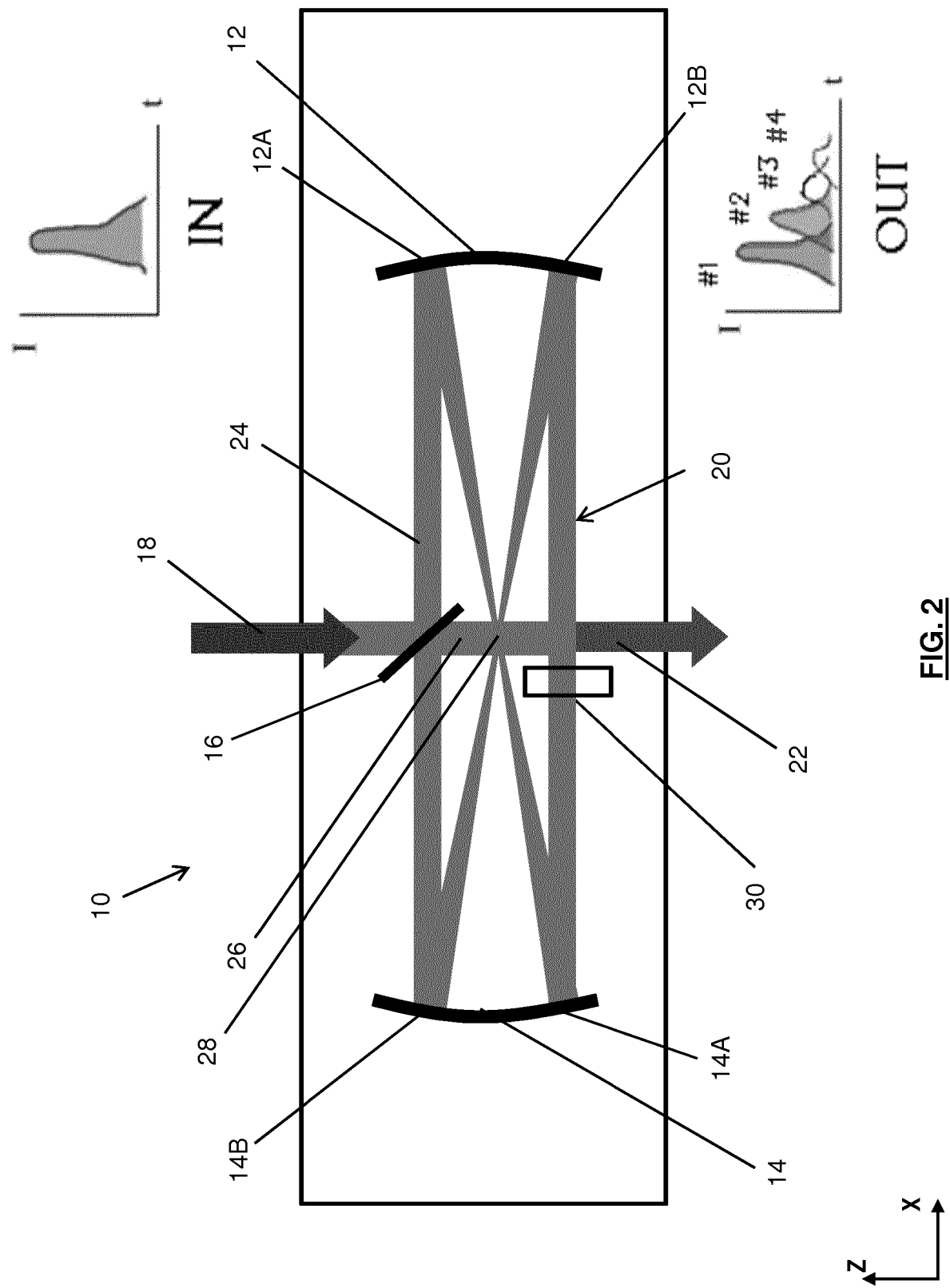
FIG. 2 depicts a schematic illustration of a pulse stretcher with a phase plate according to an embodiment of the invention.

FIG. 2 is a schematic illustration of the pulse stretcher 10. The pulse stretcher 10 is alternatively referred to herein as a pulse stretching device or simply an apparatus. The pulse stretcher 10 includes two con-focal optical resonators 12 and 14 (e.g., concave cylindrical mirrors or concave spherical mirrors) disposed such that their reflective surfaces are facing each other. More generally, the two mirrors 12, 14 form an optical arrangement (e.g., an optical resonator). The mirrors 12, 14 are separated by a predetermined distance (separation), which is approximately equal to the radius of curvature of each mirror 12, 14. Each of the mirrors 12, 14 are disposed symmetrically about a mirror axis, and the longitudinal axis of each mirror is arranged to be perpendicular to the mirror axis. A second axis, parallel to the mirror axis, contacts the surface of each mirror 12, 14 at a predetermined distance from the mirror axis. The pulse of radiation (also referred to as a beam B) is approximately collimated upon entry and exit to the pulse stretcher 10, but passes through an intermediate focal point inside the pulse stretcher 10. It will be appreciated that this is just an example of a pulse stretcher and there are many different embodiments possible, for instance: a triangular setup of flat mirrors with one of the mirrors acting as the beam splitter or arrangements with more than just two flat or spherical mirrors.

A beam splitter 16 is disposed along the second axis such that the longitudinal axis of the beam splitter 16 makes an angle of 45 degrees with the second axis. The beam splitter 16 is also disposed with its center on an optical axis, and the optical axis lies perpendicular to the second axis. It will be appreciated that the choice of angle 45 degrees is an arbitrary one, and it may be chosen differently but then the two axes are not perpendicular.

During operation, an input beam 18 (e.g., an approximately collimated beam, a slightly diverging beam, etc.) enters the pulse stretcher 10 along the optical axis of beam splitter 16. An optical delay path 20 is formed by con-focal mirrors 12 and 14. Each mirror 12, 14 can be, for example, a 100 mm diameter spherical mirror with a large radius of curvature of approximately e.g. 2000 mm, separated by an optical cavity length of approximately e.g. 2000 mm. The beam splitter 16 makes a 45 degree angle with the incoming beam 18 and is disposed such that a portion of the incoming radiation 18 is reflected into the delay path 20, and such that radiation exiting the delay path 20 is reflected out of the pulse stretcher 10 into an output radiation beam 22.

If, for example a 60R/40T (60% reflection/40% transmission) beam splitter 16 is used, beam splitter 16 reflects approximately sixty (60) percent of the incoming radiation beam 18 into the delay path 20, which will be referred to as a first reflected beam or first beam 24. The other approximately forty (40) percent of the transmitted portion of each pulse of beam 18 becomes a first sub-pulse of a corresponding stretched pulse in the outgoing beam 22. The portion of the beam 18 which is transmitted through the beam splitter 16 may be referred to as a second beam 26.

The reflected beam (first beam 24) is directed by the beam splitter 16 to mirror 12 at a position 12A; mirror 12 directs the reflected portion to mirror 14 at a position 14A; mirror 14 reflects the reflected portion back to mirror 12 at a position 12B; then the reflected portion is reflected back once again by mirror 12 to mirror 14 at a position 14B, which in turn directs it back to beam splitter 16.

At the beam splitter 16 approximately 60 percent of the first reflected light (first beam 24) is reflected perfectly in line with the first transmitted portion of this pulse (second beam 26) in outgoing beam 22 to become a second sub-pulse. Once the first reflected light (first beam 24) is reflected it may be considered to be a further second beam or just a second beam. The second beam 26 and the further second beam (which is the portion of the first beam 24 reflected from the beam splitter 16 after it has passed through the delay path 20 once) may be referred to as part of a modified beam. In some embodiments, it may be desired that the reflected beam is not perfectly in line with the first transmitted beam. In some pulse stretchers this may be used to reduce optical load on subsequent components of the optical column and also for speckle reduction to get slightly different speckle patterns for each of the beams which have been delayed with respect to the input (parent) beam, i.e., child beams.

Approximately forty (40) percent of the first reflected beam 24 is transmitted by beam splitter 16 and follows the path of the first reflected beam 24 producing additional smaller sub-pulses in the outgoing radiation beam 22. These can be considered to be further first beams (or just first beams) that are then combined with the reflected part of the first reflected beam 24 (the further second beam) to also contribute to the modified beam (the outgoing beam 22). The additional sub-pulses may all be considered to contribute to the modified beam (the outgoing beam 22) if they have sufficiently large intensity. It will be appreciated that in other embodiments, the beam splitter may have different reflection/transmission percentages.

By configuring the beam splitter 16 transmission/reflection coefficient and varying the path lengths, the resulting outgoing beam 22 may be stretched by different degrees. For example, with a delay path 20 of approximately 8 m and a 50R/50T beam splitter 16, an incoming beam 18 of time integral square (TIS) 70 ns can be stretched into a pulse in the outgoing beam 22 with a TIS pulse length of 110 ns.

As shown in FIG. 2, pulse stretcher 10 forms a focal point 28 that, in this implementation, is approximately equidistant between con-focal mirror 12 and con-focal mirror 14.

As mentioned, the input radiation beam 18 (a parent beam) is incident on the beam splitter 16 which transmits some of the radiation (light) and reflects the remainder of the radiation according to the beam splitting ratio. The reflected radiation 24 is directed into the delay path 20 which sends it back towards the beam splitter 16 with some delay due to its path length. This may be considered to be a child beam. Part of that radiation is reflected off the beam splitter 16 and thus recombined with the original transmitted radiation (second beam 26). The child beam is thus recombined with the parent beam. The transmitted radiation then goes into the delay path 20 again for a second round trip (i.e., it effectively becomes another first beam 24 travelling through the delay path 20) and so on. This results in a number of pulses (modified beam 22) that are lowered in intensity with respect to the incoming beam 18 and time delayed with respect to the original pulse.

The IN graph in FIG. 2 shows the intensity profile of the input radiation beam 18 over time. The OUT graph in FIG. 2 shows the intensity profile of the modified beam (outgoing beam 22) which is made up of a number of sub-pulses. It will be appreciated that the peak output intensity of the outgoing sub-pulses is less than the intensity of the incoming beam, e.g. the peak of the first sub-pulse of the outgoing beam may be half the peak intensity of the incoming beam. As shown in the OUT graph, each of the sub-pulses overlap the adjacent sub-pulse to some extent which provides a smoother overall outgoing beam 22. The OUT graph shows four sub-pulses because in this embodiment, four child beams are generated in the pulse stretcher 10 that have a sufficiently large enough intensity to be considered to contribute to the transmitted intensity.

As appreciated by one skilled in the relevant art, pulse stretcher 10 is just one example of a pulse stretching device. More information on pulse stretchers is given in US2010302522A1, which is incorporated herein by reference. Other pulse stretcher configurations may exist that have similar functionality.

The pulse stretcher includes a phase plate 30 (more generally referred to as an optical element) located in the delay path 20 (i.e., in the optical path of the first beam 24).

In this embodiment, the phase plate 30 is located between position 14A of mirror 14 and position 12B of mirror 12, i.e., in a collimated section of the first beam 24. It will be appreciated that in other embodiments, the phase plate 30 may be located in another part of the beam. However, it is preferred that the phase plate 30 is located where the beam has a larger diameter (for example at a collimated section of the beam) rather than at say focal point 28 where the radiation intensity is higher. This is because the phase plate 30 is more susceptible to damage in locations with higher radiation intensity.

Figure 3:
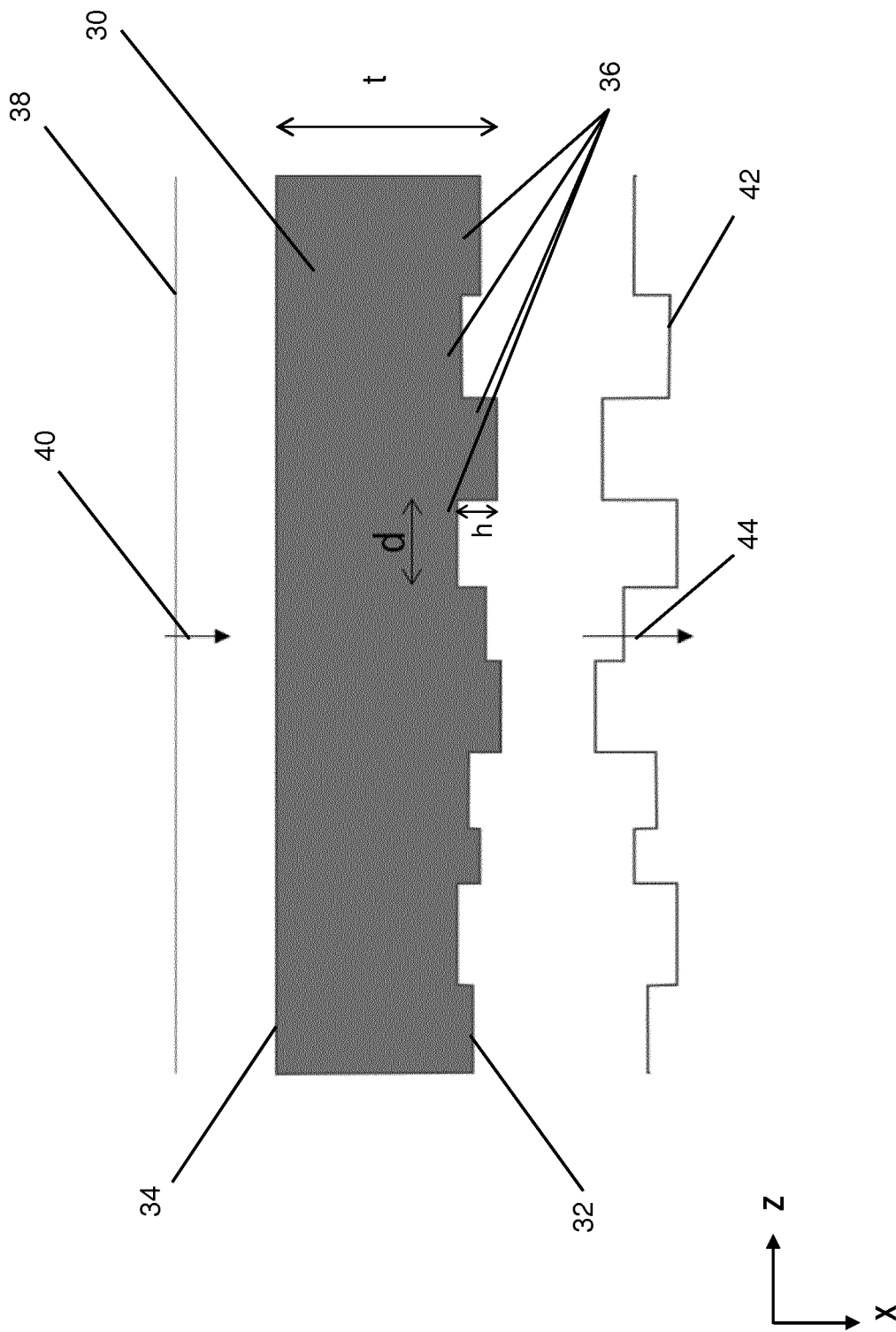
FIG. 3 depicts a schematic illustration of a phase plate according to an embodiment of the invention.

FIG. 3 shows a schematic illustration of the phase plate 30. The phase plate 30 may be anti-reflection coated to minimize radiation intensity loses (i.e., enable as much incident radiation as possible to pass through it). It is desired to minimize the roundtrip optical losses. The phase plate 30 is transparent and may be made from a glass material. The phase plate may be made from any optical material that is transparent, has very low absorption and very low scatter at the wavelength of interest. For a wavelength of radiation of 193 nm this may be UV-grade fused silica, CaF2, MgF2, crystalline quartz. The latter two materials are birefringent so one must take care to cut the material with the right orientation of the optical axis with respect to the light propagation inside the material, otherwise polarization effects may occur. At a wavelength of radiation of 248 nm the choice of material is essentially the same but the requirement for an expensive material such as CaF2 is reduced.

The phase plate 30 is a random phase plate, i.e., it provides pseudo random phase variation. This means that it has a thickness t which varies (quasi-) randomly across the surface 32 of the phase plate 30, typically with maximum height differences h between steps in the surface 32 corresponding to up to one wavelength of the radiation. The thickness t is measured in the x direction and will be in the direction in which the first beam propagates, or at least partially in the direction that the first beam propagates. The opposing surface 34 of the phase plate 30 may have a flat surface with no height differences across the surface 34.

Each of the parts of the phase plate 30 that has a height difference h with respect to its adjacent part may be considered to be a phase region 36 (i.e., phase steps). The effective thickness of the phase plate 30 at each phase region 36, defined by plate thickness t and height h, defines the effective (local) optical path length at each phase region 36. Each of these phase regions 36 may be considered to be in a phase pattern on the phase plate 30. In other words, the phase regions 36 have heights that vary across the surface 32 of the phase plate 30. For a wavelength of radiation of 193 nm, example height differences h may be random heights in the range of 0 to 200 nm. The height difference h may be even less than one wavelength, since the wavelength inside the phase plate is reduced by a factor equal to the refractive index n=1.56 at 193 nm for fused silica and n=1.48 for CaF2. It is not required that the height has to be larger than approximately one wavelength, but this is not detrimental. So for 193 nm, the radiation wavelength emitted by an argon fluoride (ArF) laser, the heights of the phase regions may be in the range of 1 to 140 nm and for 248 nm, the radiation wavelength emitted by a krypton fluoride (KrF) laser, the range of the phase regions may be 0 to 170 nm.

The varying thickness t of the phase plate 30 across its surface 32 may be considered to define the phase regions 36. Each of the phase regions 36 extend a distance d across the surface 32 of the phase plate 32. The distance d of each phase region 36 may be the same or different from the other phase regions 36, i.e. the distance d can vary across the phase plate 30. The distance d may be considered to be half the pitch of the phase region 36. Irregular sizes of the distances d of each phase region may be preferred, but they may also have regular sizes. The manufacturing method may determine the sizes. For example, there may be lithographic steps where a pattern is projected onto a plate which has been polished. After development, exposed areas may be etched to some depth and then subsequently this cycle is repeated several times with a different etch depth in each cycle, until the full area has been treated. Alternatively, focused ion beam etching could be used to directly shape the surface.

The phase pattern may be a repeating pattern over the surface 32 of the phase plate 30, such as eight (or more or less) phase regions 36 having different heights h (and different distances d) in an order that is reproduced across the surface 32. Since the phase plate 30 is a random phase plate, the phase pattern may be considered to be a random phase pattern. The phase plate 30 may be formed by any suitable method, such as etching. It will be appreciated that, when constructed, the phase plate 30 must be given a predetermined phase pattern and so it cannot be considered to be purely random as such (it may be considered quasi or pseudo random) but it is preferred for the phase pattern to be irregular.

The phase regions 36 having the random phase pattern adds a (quasi-) random phase to a wavefront 38 of the radiation beam (first beam 24) incident on the phase plate 30. That is, different parts of the wavefront of the first beam 24 are phase modulated by the phase plate 30. In other words, the phase of different parts of the wavefront of the first beam is varied. The term varied here is not intended to require that the phase of each of the different parts of the wavefront of the first beam changes over time due to the phase plate or that the phase change produced by each of the respective phase regions changes over time. That is, it is not necessary to have an active variation of the phase and it may be a passive variation of the phase, i.e., the phase variation provided to each different part of the wavefront may not change over time (temporal phase variation) due to the phase plate, rather it may be spatial phase variation due to the fixed (non-changing) shape of the phase plate being located in the first beam path. However, in other embodiments, such as described below, the phase regions may be actively varied over time, such as by changing the optical path length of the phase regions, to provide temporal phase variation as well as spatial phase variation. This may not be indicating that the phase of the beam is modulated over the time period of a single pulse.

The direction of the first beam 24 is shown by arrow 40. In placing the phase plate 30 in a part of the pulse stretcher 10 a phase difference is randomly added to different parts of the first beam 24. A wavefront 42 outgoing from the phase plate 30 in the direction of the arrow 44 is shown to have a modulated (varied) phase with respect to the wavefront 38 of the input first beam 24.

Thus, the child beam (first beam 24) after traversing the delay path 20 will not have an identical phase relation between different parts of the wave front as for the parent beam. Subsequent child beams (further first beams) will have yet different phase distributions because each child beam is displaced relative to its parent by a small distance determined by the thickness of the beam splitter 16. Different child beams each traversing at different positions of the phase plate and thus getting a different random phase shift across their wavefront, compared to all other child beams, provides good phase randomization and thus speckle reduction.

The phase plate 30 is a transmissive optical element. The phase plate 30 is configured such that the phase of the different parts of the wavefront of the first beam 24 is varied after transmission through the phase plate 30. Due to the phase regions having different heights h (due to the varying thickness t of the phase regions), the radiation will spend longer in the phase plate 30 in some of the phase regions 36 than in others. Thus, some parts of the wavefront of the first beam 24 will exit the phase plate surface 32 before other parts of the wavefront of the first beam 24. This will mean that there will be a phase variation between those parts of the wavefront of the first beam 24.

It will be appreciated that the phase plate 30 shown in FIG. 3, and in particular the sizes of the phase region 36 steps and the resulting modulation of the wavefront, of the outgoing wave is not to scale.

It will be appreciated by the skilled person that phase modulation, or phase shifts, may be obtained by phase regions on surface 32 or 34 or on both.

Since the child beam after traversing the delay path 20 will not have an identical phase relation between different parts of the wave front as for the parent beam, the coherence of the modified beam is reduced. This coherence may be the spatial coherence.

As mentioned above, speckle is a result of the coherence properties of the light source and therefore to reduce speckle it is important to consider the coherence properties of the source of the radiation.

Temporal coherence is linked to the spectral bandwidth of the laser (radiation source) which for a purely monochromatic wave would be infinitely long, meaning that at fixed positions in the beam there exists a definite, fixed phase relationship for the electric field at different times. As a result, if part of a beam would be delayed by an arbitrary time it would still interfere with the original beam when combined. In practice the bandwidth is finite and thus for points on the wavefront there exists a fixed phase relationship for a finite time only, typically a few 10ths to a few ns for DUV lithography lasers.

Spatial coherence is related to the existence of a definite, fixed relationship of the phase of the electric fields of pairs of points at different positions in the beam and at the same time. The larger the spatial coherence, the larger the distance between 2 points on the wavefront between which a phase relationship exists. Typical spatial coherence lengths are of the order of sub-millimeter to several millimeters for DUV lithography lasers.

Reduced coherence thus leads to reduced speckle. In practice this translates into a source with a bandwidth that is as large as allowed by the imaging (in view of the chromatic aberrations of the projection lens). The need for a low spatial coherence translates into a source that has the maximum size and divergence that can be accepted by (i.e., transmitted through) the optical column.

For pulse stretching there is a connection between temporal coherence and the spatial coherence. This can be seen when we think of a theoretical pulse stretcher which generates time-delayed copies of an incoming beam that are in every aspect identical to the parent beam. In that case, the speckle pattern generated by each of the child beams is identical to the parent beam and since they are time-delayed the intensities of the speckle pattern should simply be added. This means that the mean and the variations are just simply multiplied by some multiplicative factor, but, in relative terms, the standard deviation (as well as the speckle pattern) remains the same. This speckle pattern being the same in theory for the parent and child beams means that the speckle contrast will not be reduced in the combined modified outgoing beam. The overall reduction in speckle contrast is given by the averaging obtained by summing over different speckle patterns. The speckle contrast may be defined at the intensity variation relative to the mean intensity.

In reality, each of the child beams is (slightly) different from the parent beam and all the other child beams, which may be due to alignment of the pulse stretcher and the contribution by optical components such as the beam splitter (which may or may not be alleviated by the use of a compensator). Thus, individual speckle patterns are different and, since they are stochastic in nature, overlaying these speckle patterns will result in a reduced variation relative to the mean intensity. However, taking into account the theoretical pulse stretcher above, it has been realized that it is not necessarily correct that simply stretching the pulse to longer duration will result in better speckle reduction.

The inclusion of the phase plate 30 into the pulse stretcher 10 provides a reduction in the coherence of the modified outgoing beam 22, with respect to the input beam 18, which leads to a reduction in the overall speckle pattern in the outgoing radiation beam 22. This is because the child beam, after traversing the delay path 20, will not have an identical phase relation between different parts of the wavefront as for the parent beam and the speckle pattern will be different. The speckle pattern being different between each child and parent beam leads to an averaging out of the intensity distributions and smaller variation of the dose (intensity) than what would be achieved without the phase plate 30.

Furthermore, the subsequent child beams (further first beams) have slightly different phase distributions from the parent beam due to the displacement relative to its parent beam by a small distance corresponding to the thickness of the beam splitter 16. This is, in itself, partially beneficial for speckle reduction. This is because slightly different sections of the parent beam and each of the child beams overlap in the final transmitted modified beam 22 due to the displacement introduced by the beam splitter 16. However, the phase plate 30 enhances this effect because each child beam also sees a different phase shift due to the phase plate 30 compared to the original parent beam. The invention has been made possible due to the realization that coherence of child pulses can be further reduced than what is possible with simply copying of the parent beam.

A reduction in speckle in the radiation beam will ultimately result in better yield of the substrates in the lithography process. This is due to the better critical dimension uniformity (CDU) and overlay from the reduction in speckle.

Figure 4:
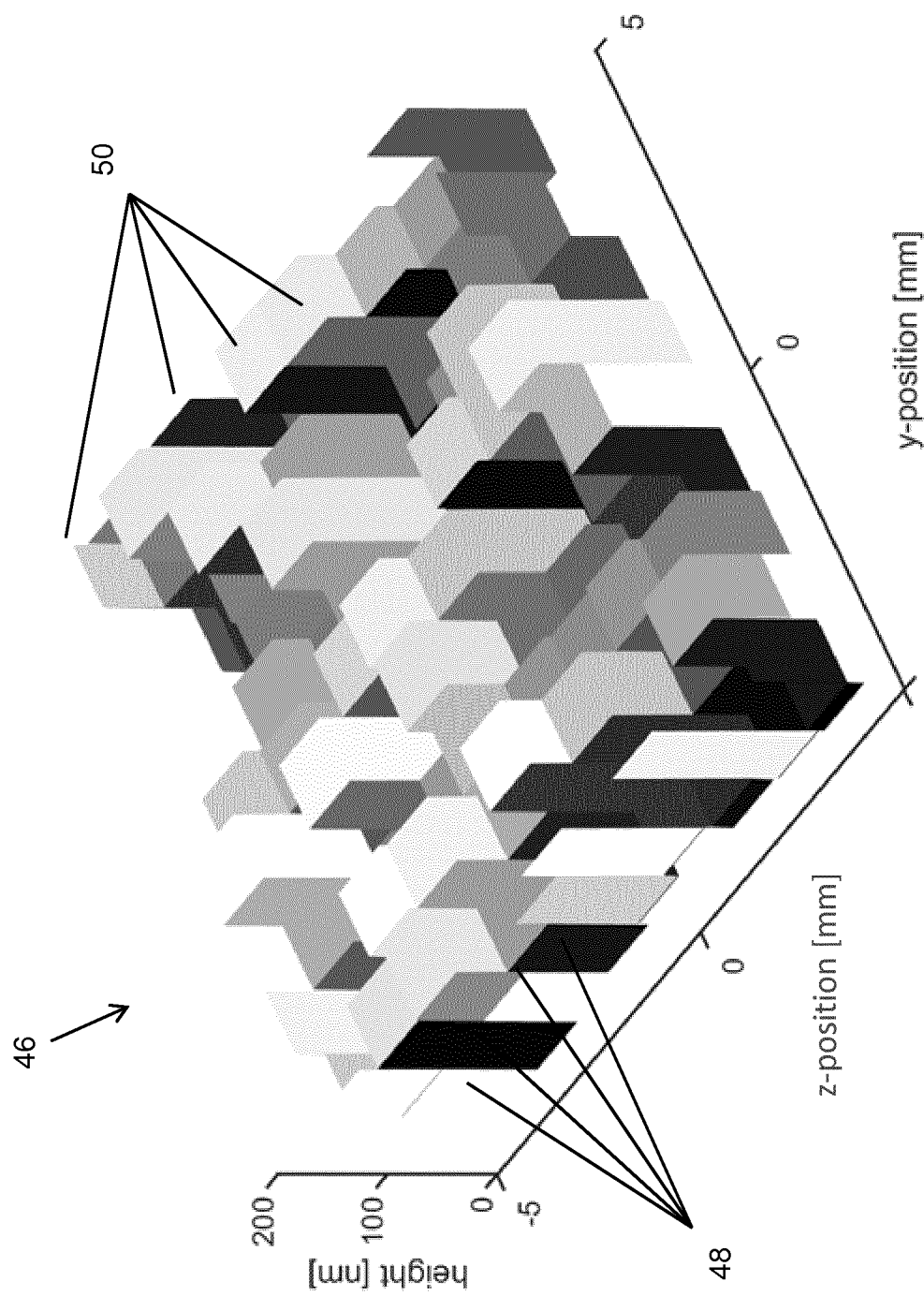
FIG. 4 depicts a 3D schematic illustration of a phase plate according to an embodiment of the invention.

FIG. 3 shows a cross sectional view of the phase plate 30 and the varying heights h of the surface 32 of the phase plate 30 are only shown in 1 dimension, i.e., in the z direction. In some embodiments, the phase regions 36 may extend at the same height h across the surface in one direction (y direction) and have the varying heights in the other orthogonal direction (z direction). In other embodiments, and as shown in FIG. 4, the varying heights of the phase regions may occur in two dimensions (e.g. two orthogonal directions, y and z direction) across the surface of the phase plate. Thus, each phase region may extend a distance $d_1$ in one direction and a distance $d_2$ in another direction. FIG. 4 shows a random height phase plate 46 with phase regions 48 with square faces 50. It will be appreciated that in other embodiments, the heights may be different and the faces may be a different shape.

The phase regions may have any suitable shape to provide the desired phase modulation. For example, the phase regions may be have a cross sectional shape of a regular polygon, an irregular polygon, a triangle, a pentagon, a square, a circle, a rectangle, or an ellipse. With round or elliptical shaped phase regions, a full plane cannot be filled. In this case, some tessellation may be required that may fill a plane. It may be regular polygons (so triangles, squares, hexagons) but in general it does not have to be regular polygons. It just needs to fill a plane (or the surface of a curved mirror) and it may be any combination of irregular polygons e.g. triangles and pentagons.

A further enhancement of the effect of the phase plate 30 can be achieved by tuning the size d of the phase regions 36 (i.e. ~half the pitch of the phase plate). If the pitch is made smaller than the spatial coherence length of the incoming beam (and preferably also non-commensurate, so not close to a subdivisor of the coherence length) then each coherence cell of the child beams is divided up in parts which do not completely constructively interfere and the net result will be a reduction in speckle contrast. A coherence cell is a region in space where the phase of the electric field at each point in the cell has a fixed, definite relationship with the phase of the field at any other point in the cell. Therefore, the electric fields can and will interfere with one another resulting in intensity variations across a detector, e.g. the resist on the wafer.

Making the pitch of the phase plate 30 too small will lead to an increase in divergence of the radiation beam which may eventually lead to loss of transmission of the radiation beam in the lithographic apparatus LA since it would not be accepted by the optical column of the lithographic apparatus LA. Therefore, the angles under which the radiation is diffracted from the phase plate 30 should be kept smaller than approximately a quarter of the acceptance angle of the radiation in the optical column. To do this, the size d of the phase region 36 is limited so it is not too small as explained in the example below. The factor 4 is indicated because in a pulse stretcher 10 effectively approximately 3 or 4 child beams are being generated that contribute to the transmitted intensity, as shown in the OUT graph of FIG. 2. More generally, the phase plate 30 is configured such that the angle at which the radiation is diffracted from the phase plate 30 is less than a fraction (for example a quarter) of the acceptance angle of the radiation in an optical column. The fraction is calculated as the reciprocal of the number of first beams 24 (i.e., child beams) that substantially contribute to the transmitted intensity of the modified beam (the outgoing beam 22).

The first-order diffraction angle is given in Eq. 1:

$$\sin(\theta) \sim \lambda/2 \cdot d \quad (1)$$

where d is half the pitch of the phase regions 36. For example, for a wavelength of approximately 200 nm, and an acceptance half-angle of 2 mrad, this would lead to a pitch of the phase regions of approximately 1 mm, and thus a size d of the phase regions 36 of approximately 0.5 mm.

The pitch of the phase plate 36 may be different in two orthogonal directions depending on the divergence of the incoming beam in the two directions and the acceptance angles of the optical column of the lithographic apparatus LA. Also, the spatial coherence length could be different for two orthogonal directions leading to different values of the pitch for different directions. In both cases this would lead to optimized phase regions 36 with a rectangular or elliptical shape in case the two pitches are different. However, even for other shapes (for example square or round) an improvement in speckle reduction is achieved with a pulse stretcher 10 equipped with a phase plate 30.

As explained above, in some embodiments a 1-D phase plate 30 may be used, where the phase regions 36 have a pattern (i.e., have different sizes d with different heights h) only in one direction and in the other direction cover the full length of the surface 32 of the phase plate 32 at the same height h. This would be useful in case it was desired that the divergence in the "long" direction (i.e., the direction that does not have varying heights of the phase regions 36) was not to be increased by the phase plate 30, for example, because of acceptance issues.

In the embodiment described above, a phase plate 30 is used as the optical element to provide the phase modulation (variation) to the wavefront of the first beam 24. However, in other embodiments, the optical element may be a different component. For example, the phase plate 30 may be replaced with a different optical element, such as a diffuser.

Figure 5:
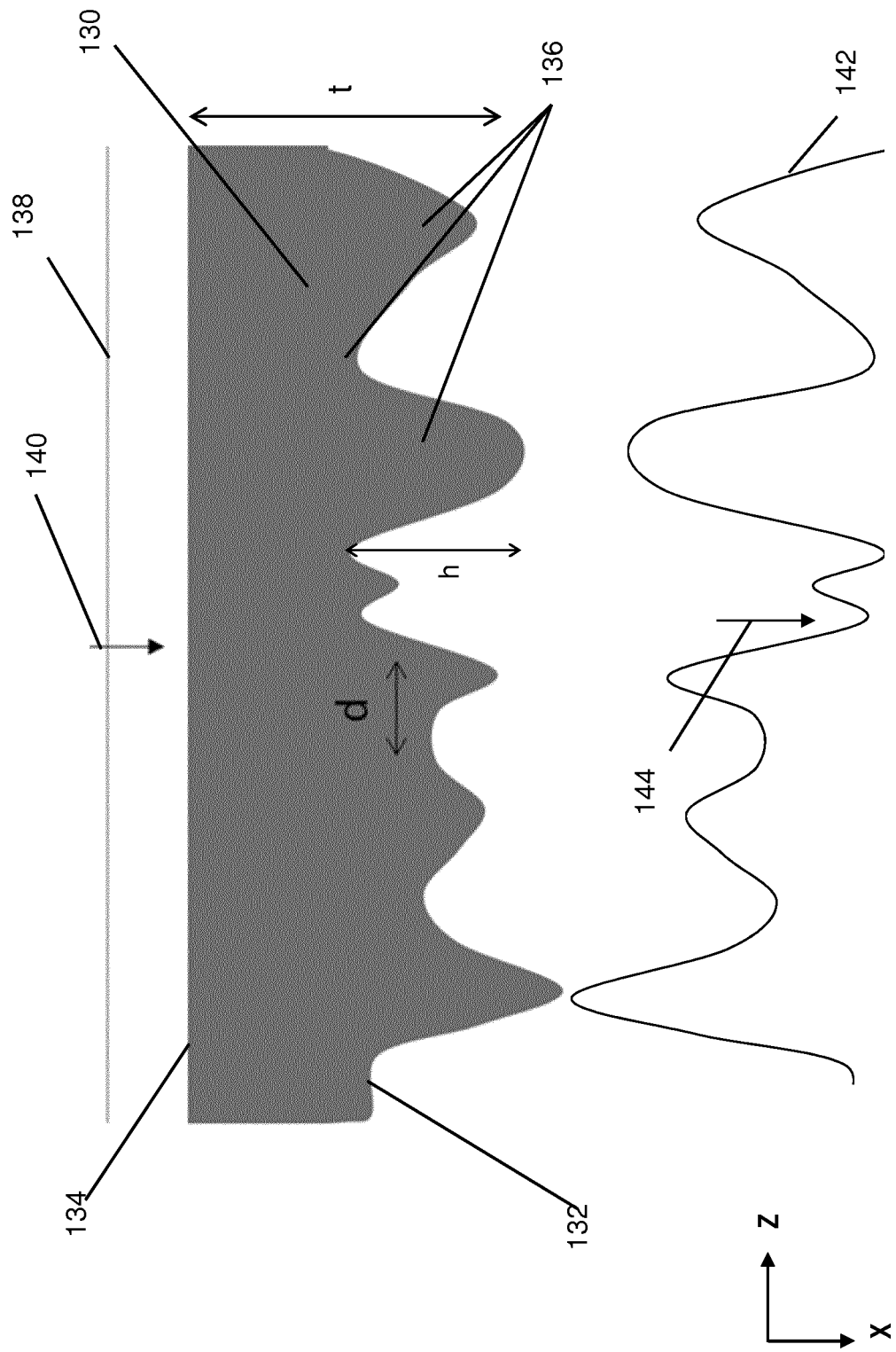
FIG. 5 depicts a schematic illustration of a diffuser according to an embodiment of the invention.

In FIG. 5, a schematic of an exemplary diffuser 130 is illustrated. Reference numerals incremented by 100 have been used for the same or similar parts of the diffuser 130 as for the phase plate 30. The diffuser 130 is similarly located in an optical path 20 of the first beam 24. The diffuser 130 functions in a similar manner to the phase plate 30 in that the diffuser 130 is configured such that different parts of a wavefront of the first beam 24 are phase modulated (varied) to reduce the coherence of the first beam 24 in comparison with the second beam 26. This in turn leads to reduced speckle in the outgoing beam 22 when compared to the input beam 18.

The diffuser 130 is a transmissive optical element. The diffuser 130 has a surface 132 that is rough enough to provide the necessary scatter of radiation to phase modulate the wavefront of the beam but is not so rough as to scatter the radiation so much that the radiation beam is not convergent enough to be accepted by the optical column of the lithographic apparatus LA.

The "pitch" of the diffusing areas of the diffuser 130 should be chosen such that it matches the spatial coherence length of the input first beam 24 in a similar way to the matching of the pitch of the phase plate 30. Further, the divergence angle of the radiation transmitted by the diffuser 130 should be kept small enough so as to incur no appreciable losses.

An exemplary profile of the surface 132 of the diffuser 130 and the resulting transmitted wavefront of the first beam 24 is shown in FIG. 5. A flat incoming wavefront 138 is deformed according to the shape of the diffuser 130. It will be appreciated that FIG. 5 is not to-scale, in particular the height of the diffuser 130 peaks and valleys are shown much larger. An effect of the diffuser 130 would also be to enlarge divergence. This is implicit in the shape of the outgoing wavefront 142 since rays propagate perpendicular to the wavefront 142.

The varying heights h of the surface 132 of the diffuser 130 are only shown in 1 dimension, i.e., in the z direction. In a similar way to as with the phase plate 30, in some embodiments, the phase regions 136 may extend at the same height h across the surface in one direction (y direction) and have the varying heights in the other orthogonal direction (z direction). In other embodiments, the varying heights of the phase regions may occur in two dimensions (e.g., two orthogonal directions, y and z direction) across the surface of the diffuser 130. Thus, each phase region 136 may extend a distance $d_1$ in 1 direction and a distance $d_2$ in another direction.

The phase plate 30 may have an advantage over the diffuser 130 in that the phase plate 30 may be tuned to give diffraction primarily in the $0^{th}$ order, and thus reduce losses due to large angle diffraction. This may be more difficult to achieve with the diffuser 130.

In other embodiments, the diffuser 130 and the phase plate 30 may be located in other parts of the pulse stretcher 10 and/or may be incorporated into other parts of the optics, such as the beam splitter or the optical arrangement (for example mirrors). More generally, other optical components may incorporate the optical element(s) that provide the phase modulation of the first beam 24 with respect to the second beam 26.

Figure 6:
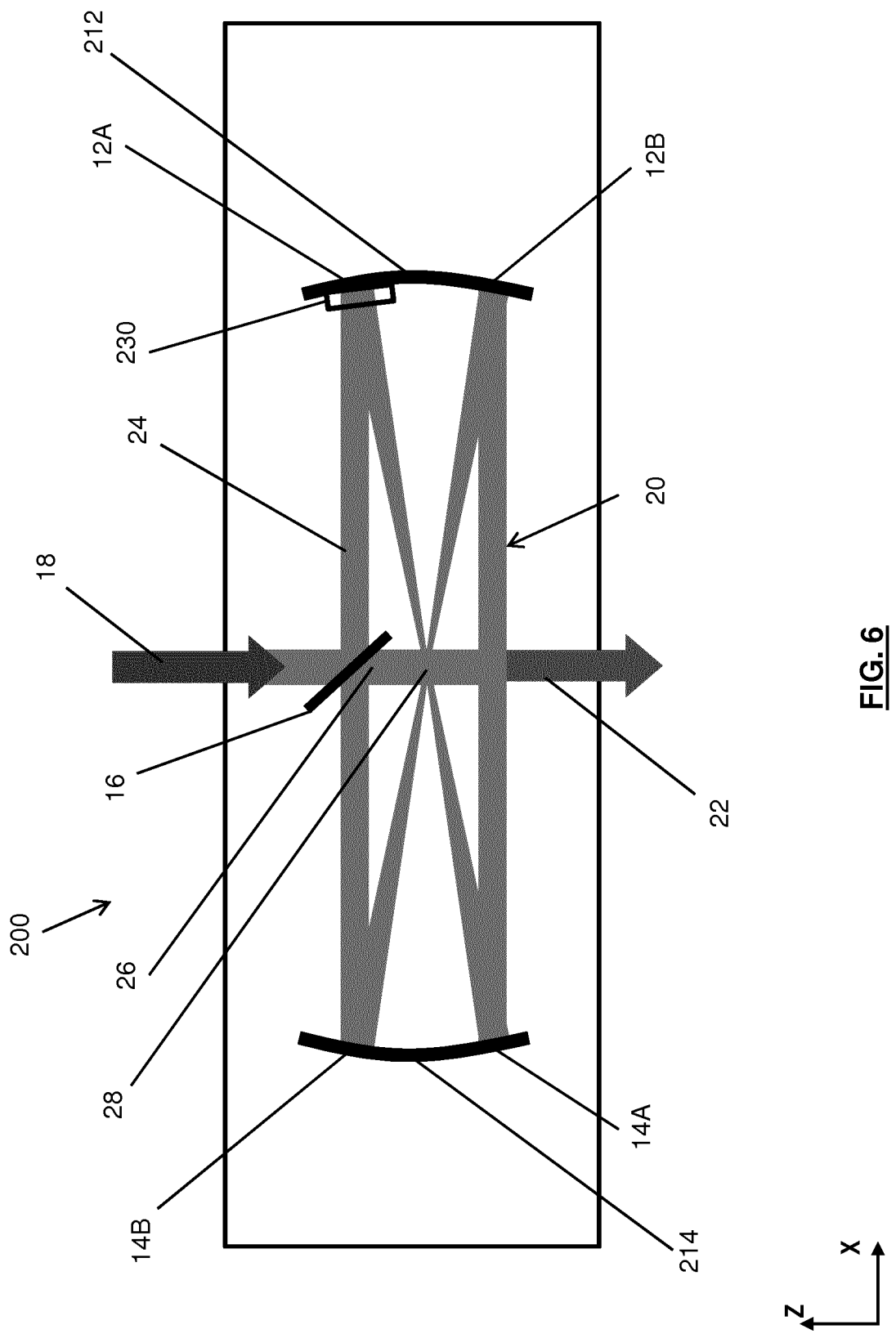
FIG. 6 depicts a schematic illustration of a pulse stretcher with a mirror comprising an optical element according to an embodiment of the invention.

FIG. 6 is a schematic illustration of a pulse stretcher 200. The pulse stretcher 200 is the same as the pulse stretcher 10 except that the phase plate 30 has been replaced with an optical element 230 located in position 12A of mirror 212. The same reference numerals have been used for the parts of the pulse stretcher 200 corresponding to the parts of the pulse stretcher 10.

The optical element 230 may be considered to be the profile of the surface 32 of the phase plate 30 provided in the surface of the mirror 212, for example in position 12A.

Figure 7:
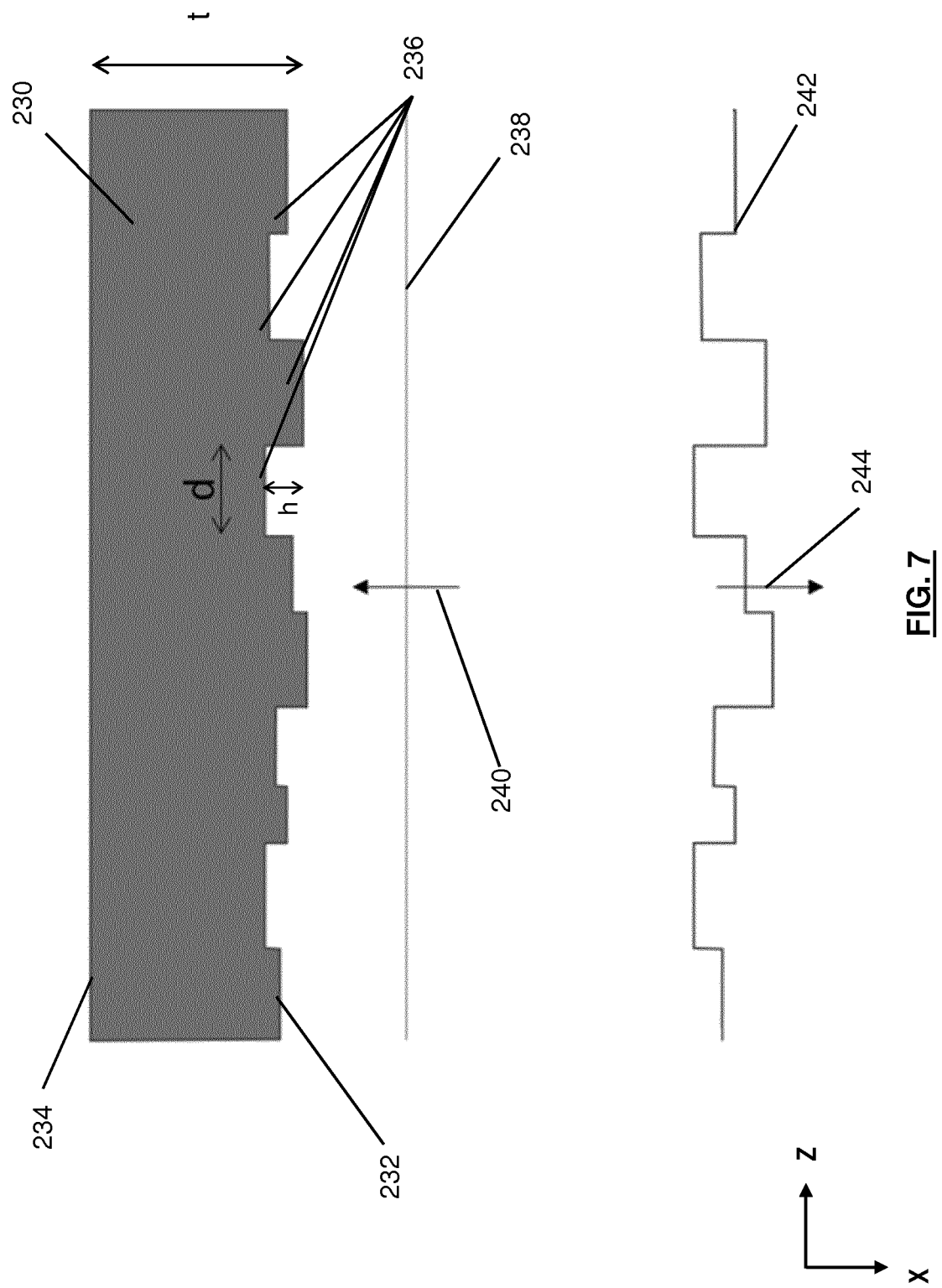
FIG. 7 depicts a schematic illustration of a surface of a mirror comprising an optical element according to an embodiment of the invention.

FIG. 7 shows a schematic view of the optical element 230, which is similar to the phase plate 30 shown in FIG. 3 except it forms part of the mirror 212. However, the optical element 230 is a reflective optical element. Reference numerals incremented by 200 have been used for the same or similar parts of the optical element 230 as for the phase plate 30.

The mirror 212 (comprising the optical element 230) has random phase regions 236 (or phase steps) on the reflecting surface 232. The optical element 230 has a mirror coating. It is desired to minimize the roundtrip optical losses. The incoming beam 24 has, for example, a flat wavefront 238. In other examples, the wavefront could be curved. The reflected beam has its wavefront 242 deformed with parts of the wavefront that were reflected from phase regions 236 having a higher height h preceding those that were reflected from phase regions 236 having a lower height h. The phase difference corresponds to twice the height of the peaks and valleys of the surface 232 of the optical element 230, i.e., the heights h of the phase regions 236. This is because, on reflection, the beam traverses twice this difference.

Therefore, the surface of the mirror 212 in the position 12A has phase regions in a phase pattern in the same way as the phase plate 30 as shown in FIG. 3. This means that the radiation that is incident on the mirror 212 will reach the phase regions 236 with higher height h before the phase regions 236 with lower height h such that different parts of the wavefront of the first beam 24 are phase varied (modulated) with respect to the second beam 26. The optical element 230 may be referred to as a random phase plate reflecting surface. In other embodiments, the surface of the mirror 212 in the position 12A instead has phase regions in a phase pattern in the same way as the diffuser 130 as shown in FIG. 5 (in this case the optical element 230 may be referred to as a random diffuser reflecting surface), or any other suitable shape of phase regions. It will be appreciated that, although the optical element 230 is located in position 12A of mirror 212, it could equally be incorporated into other positions in the mirrors 212, 214, such as position 12B of mirror 212 or positions 14A, 14B of mirror 214.

The mirrors 212, 214 may be made from a glass material. The mirrors may be a glass material that is easy to polish such as fused silica. The material of the mirrors may be transparent at the wavelength in question (e.g., 193 nm) but requirements on homogeneity of the refractive index ("Schlieren") or bubbles or inclusions are less stringent than for transmissive optics. The reason it should still be transmissive is that the mirror coating will not have a 100% reflectivity so some of the light still penetrates the substrate where it could lead to direct damage of the substrate or indirect damage to the coating if the light were absorbed too strongly in the substrate material.

The phase modulation could be applied locally by etching part of the mirror surface prior to coating. Since coating is conformal it will still show the height profile of the underlying substrate.

A transmissive phase plate 30 with phase regions 36 at the surface 32 may be placed directly on a mirror surface, for example on surface 12A, or the backside of the transmissive phase plate may be reflectively coated. For the embodiment of a phase plate 30, the radiation propagates twice through the transmissive phase plate, and hereby experiencing twice a phase shift.

Figure 8:
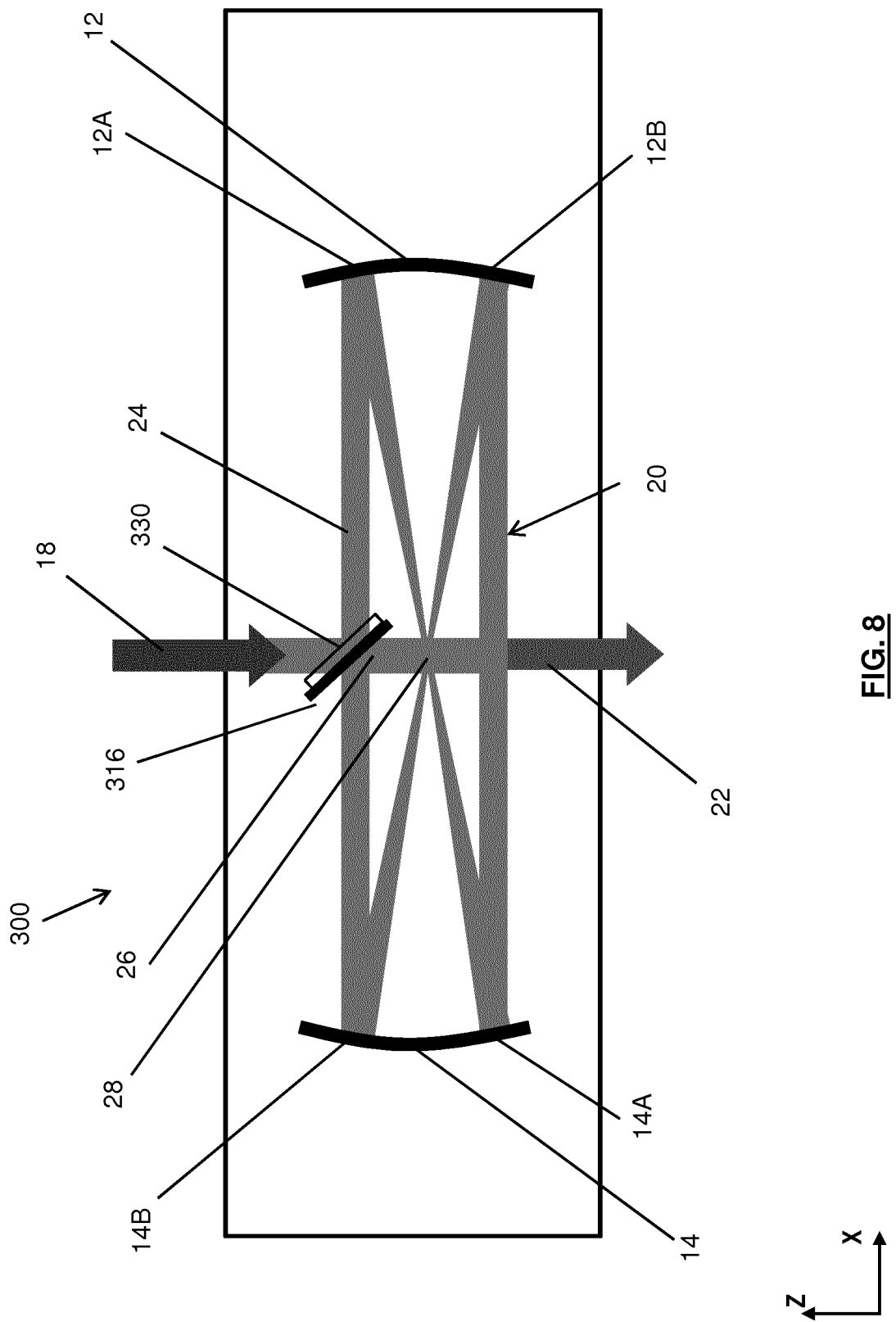
FIG. 8 depicts a schematic illustration of a pulse stretcher with a beam splitter comprising an optical element according to an embodiment of the invention.

FIG. 8 is a schematic illustration of a pulse stretcher 300. The pulse stretcher 300 is the same as the pulse stretcher 200 except that, instead of the optical element 230 being located at position 12A of the mirror 212, an optical element 330 is located with the beam splitter 316. More particularly, the beam splitter 316 comprises the optical element 330. The same reference numerals have been used for the parts of the pulse stretcher 300 corresponding to the parts of the pulse stretcher 10 and pulse stretcher 200.

In FIG. 8, the beam splitter 316 is shown with the optical element 330 being located on the side of the beam splitter 316 facing the direction from which the input radiation beam 18 arrives. Thus, the optical element 330 is a reflective optical element which provides the phase modulation to the wavefront of the first beam 24 as it is reflected from the beam splitter 316 towards the mirror 12. In this case, the optical element 330 may be considered to be located in the optical path 20 of the first beam 24.

The beam splitter 316 may be made from the same materials as the phase plate 30. That is, the beam splitter 316 may be made from any optical material that is transparent, has very low absorption and very low scatter at the wavelength of interest. For example, this may be UV-grade fused silica, CaF2, MgF2, or crystalline quartz.

The surface of the beam splitter 316 may be implemented with a random phase pattern in phase regions, so that the reflected first beam 24 already has the modulated phase as it goes into the delay path 20. The optical element 330 should either have a reflectivity equal to the beam splitter coating, or be anti-reflection coated (at the other side of the beam splitter). It is desired to minimize the roundtrip optical losses. In other embodiments, the optical element may be located on the other side of the beam splitter. For a beam splitter with one of its surfaces acting as either a phase plate in transmission or a phase modulating mirror in reflection, the effect would be represented by either FIG. 3 or FIG. 7 respectively, depending on how the radiation was traveling through the beam splitter 316. Since the outgoing beam 22 will always have passed through the beam splitter 316 (be it as the first transmitted beam or subsequently one of the reflected beams) all parent and child sub-beams are modulated in phase by the random-phase beam splitter 316. It is therefore not important on which side of the beam splitter 316 the phase modulation (optical element 330) is applied, on the partially reflective side or on the anti-reflection coated side. Also the orientation of the beam splitter 316 is not important, i.e., whether the original incoming beam 18 first strikes the anti-reflection coated side or the partial reflecting side.

Incorporating the optical elements, for example the transmissive and/or reflective optical elements, in the beam splitter and/or the mirror may have the advantage of a reduction in optical components which would lead to lower losses of the radiation beam (and better transmission and pulse stretching) and lower cost.

In another embodiment, the optical element may be configured such that the phase regions are actively modifiable to change the phase variation to the different parts of the wavefront of the first beam. That is, the optical element may incorporate actively deformable mirrors or phase plates. Thus, the phase regions may be actively modifiable to change the phase variation to the different parts of the wavefront of the first beam. This phase variation may be considered to be active variation of the phase which may be varied over time (temporal phase variation).

If a mirror in the delay path is deformed actively, e.g., by means of controlled push-pull actuators, it can be given, in principle, any form including the desired form for the random phase mirror. For example, this may provide an advantage if the coherence of the incoming radiation beam were to change over time. This could happen e.g. due to ageing of the gas mixture in the excimer laser and/or of the laser's optical components leading to different coherence lengths of the beam coming out of the laser. In that case, actuator adjustment, based on periodic measurement of the coherence, can then be periodically applied. Alternatively, an on-line coherence measurement could be used that would continuously monitor the coherence and based on its results adjust the shape of the mirror. This would involve the use of a control loop. The coherence measurement could be based upon in-resist measurements, or could use a measurement setup in which the speckle intensity is measured either continuously on-line or in a dedicated test using a so-called speckleometer. A speckleometer is an instrument that measures speckle intensity, e.g., with a camera or other position dependent intensity measurement device.

Similar to the actively deformed mirror, a phase plate consisting of a deformed transparent plane parallel plate could be used, for example a beam splitter plate or a plate in one of the legs of the pulse stretcher. In that case, modulation of the transmitted wavefront could be achieved by heating the plate with an array of heater wires (or a crossed pair of arrays of heater wires), embedded in the bulk or applied to the surface of the plate. This would have the effect of locally changing the refractive index and thereby modulating the transmitted wavefront. Alternatively, actuators could be applied to the sides of the phase plate to deform it and thus create a phase distortion for the transmitted beam.

The same effect may be achieved by applying electric or magnetic fields to a transmissive phase plate 30 in case the phase plate 30 contains electrooptic or magnetooptical materials, respectively. When an electric (magnetic) field is applied to a electrooptic material, optical properties of the electrooptic material, for example the refractive index, may be altered. This phenomenon is known as the Pockel's effect. In an embodiment, the phase variation at phase regions 36 may be obtained by changing locally the refractive index by applying either an electric field, or a magnetic field, or both to the transmissive phase plate.

Phase variations by means of electric fields and or magnetic fields may be static, dynamic, as well as quasi-static. That is, the resulting variation may depend on the time-variation of the applied electric and or magnetic fields.

The pulse stretchers including the optical elements described above may be used in a variety of situations and apparatus. Generally, pulse stretchers may be located at the exit of a laser (for example an excimer laser) and/or located inside a laser (for example an excimer laser).

For example, optical elements of the type described above could be included in a cascaded series of pulse stretchers either inside or outside the excimer laser where each pulse stretcher could have a random phase plate/mirror/beam splitter to reduce the coherence of the beam. These may be in a laser with a double stage internal pulse stretcher followed by a double stage external pulse stretcher. Each of these stages could incorporate a phase plate or similar as proposed for a significant overall reduction of speckle.

As another example, the pulse stretchers including the optical elements described above may be used in so-called MOPA (Master Oscillator-Power Amplifier) or MOPO (Master Oscillator-Power Oscillator) laser systems. In these systems, a low power master oscillator is used to generate the light with well-defined narrow-band spectral properties and beam propagation properties (as defined by its divergence and cross section). The light is subsequently amplified in a PA or it is used to injection-seed a PO. The PA just amplifies the light whilst, for the PO, the oscillator is "locked" to the injected light and thus will generate light with the same spectral and propagation properties as the injection seed. For the MOPA and MOPO a proposed coherence reducing pulse stretcher placed between the MO and the PA/PO may help reduce the spatial coherence of the incoming light from the MO and thus significantly reduce the coherence of the light out of the PO/PA.

In particular this would be useful if a so-called hybrid laser were used, where the MO stage of the system may be a solid-state laser (consisting of pulsed, diode-pumped oscillators, combined with non-linear techniques such as harmonics generation and sum- and difference-frequency generation to obtain the required pulsed DUV radiation). This solid state laser has relatively particularly high spatial coherence: typically a solid state laser would have no more than a few spatial modes while an excimer laser would emit light in several hundred spatial modes, each mode being independent, i.e. incoherent, with respect to the other modes. Therefore, coherence of a solid-state laser generally is much higher than for an excimer laser which already may have high coherence. The high spatial coherence of the MO would then result in a (in relative terms) very high spatial coherence of the hybrid laser. Insertion of a proposed pulse stretcher between MO and PO/PA would thus significantly reduce the coherence and thereby improve speckle in lithography systems using such a hybrid laser.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etcetera.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Aspects of the invention are set out in the clauses below.
1. An apparatus for increasing a pulse length of a pulsed radiation beam, the apparatus comprising: a beam splitter configured to split an input radiation beam into a first beam and a second beam; an optical arrangement, wherein the beam splitter and the optical arrangement are configured such that at least a portion of the first beam is recombined with the second beam into a modified beam after an optical delay of the first beam caused by the optical arrangement; and at least one optical element in an optical path of the first beam, the at least one optical element configured such that the phase of different parts of a wavefront of the first beam is varied to reduce coherence between the first beam and the second beam.
2. The apparatus of clause 1, wherein the at least one optical element comprises phase regions across a surface of the at least one optical element, the phase regions configured to provide the phase variation to the different parts of the wavefront of the first beam.
3. The apparatus of clause 2, wherein the phase regions have heights that vary across the surface of the at least one optical element to provide the phase variation to the different parts of the wavefront of the first beam.
4. The apparatus of clause 3, wherein the varying heights of the phase regions occur in two dimensions across the surface of the at least one optical element.
5. The apparatus of either of clause 2 to 4, wherein the at least one optical element has a varying thickness across its surface to define the phase regions.
6. The apparatus of any of clauses 2 to 5, wherein the phase regions are configured to provide random phase variation.
7. The apparatus of any of clauses 2 to 6, wherein the phase regions have a shape of one of regular polygon, irregular polygon, triangle, pentagon, square, round, rectangular, and elliptical.
8. The apparatus of any of clauses 2 to 7, wherein the at least one optical element is configured such that the pitch of the at least one optical element is less than the spatial coherence length of the input radiation beam.
9. The apparatus of any of clauses 2 to 8, wherein the at least one optical element is configured such that the pitch of the at least one optical element is non-commensurate with the spatial coherence length of the input radiation beam.
10. The apparatus of any of clauses 2 to 9, wherein the at least one optical element is configured such that the angle at which the radiation is diffracted from the at least one optical element is less than a fraction of the acceptance angle of the radiation in an optical column, the fraction being the reciprocal of the number of first beams that substantially contribute to the transmitted intensity of the modified beam.
11. The apparatus of any of clauses 2 to 10, wherein the at least one optical element is configured such that the phase regions are actively modifiable to change the phase variation to the different parts of the wavefront of the first beam.
12. The apparatus of any preceding clause, wherein the at least one optical element is a transmissive optical element which is configured such that the phase of the different parts of the wavefront of the first beam is varied after transmission through the transmissive optical element.
13. The apparatus of clause 12, wherein the transmissive optical element is a phase plate located in the optical path of the first beam.
14. The apparatus of clause 12, wherein the transmissive optical element is a diffuser located in the optical path of the first beam.
15. The apparatus of any of clauses 1-11, wherein the at least one optical element is a reflective optical element which is configured such that the phase of the different parts of the wavefront of the first beam is varied after reflection from the reflective optical element.
16. The apparatus of clause 15, wherein the reflective optical element is at least one of a random phase plate reflecting surface and a random diffuser reflecting surface.
17. The apparatus of either of clauses 15 or 16, wherein the beam splitter comprises the reflective optical element.
18. The apparatus of clause 17, wherein the reflective optical element is configured such that the phase of different parts of a wavefront of the second beam is varied.
19. The apparatus of either of clauses 15 or 16, wherein the optical arrangement comprises at least a mirror, wherein the mirror comprises the reflective optical element.
20. The apparatus of any preceding clause, wherein the optical arrangement is a con-focal resonator including a first con-focal mirror and a second con-focal mirror.
21. The apparatus of any preceding clause, wherein the apparatus is located in or at the exit of at least one of a laser, an excimer laser, a solid state laser, a solid state oscillator, a master oscillator, a power amplifier, a master oscillator power amplifier, a power oscillator, a master oscillator power oscillator, and a hybrid laser.
22. The apparatus of clause 20, wherein the apparatus is located between at least one of the master oscillator and the power amplifier, the master oscillator and the power oscillator, the solid state oscillator and the power amplifier, and the solid state oscillator and the power oscillator.
23. The apparatus of either of clauses 12 or 13, wherein the at least one optical element comprises at least one of an electrooptic material and a magnetooptical material.
24. A lithographic apparatus comprising the apparatus of any preceding clause.

25. The lithographic apparatus of clause 24, wherein the apparatus is located in a beam delivery system of the lithographic apparatus.

26. The lithographic apparatus of either of clauses 24 or 25, further comprising: an illumination system configured to condition a radiation beam; a support structure constructed to support a patterning device, the patterning device being capable of imparting the radiation beam with a pattern in its cross-section to form a patterned radiation beam; a substrate table constructed to hold a substrate; and a projection system configured to project the patterned radiation beam onto the substrate.

27. A method for increasing a pulse length of a pulsed radiation beam using an apparatus, the method comprising passing an input radiation beam through a beam splitter of the apparatus to split the input radiation beam into a first beam and a second beam; passing the first beam through an optical arrangement of the apparatus, wherein the beam splitter and the optical arrangement are configured such that at least a portion of the first beam is recombined with the second beam into a modified beam after an optical delay of the first beam caused by the optical arrangement; and varying the phase of different parts of a wavefront of the first beam using at least one optical element in an optical path of the first beam to reduce coherence between the first beam and the second beam.

28. The method of clause 27, wherein the at least one optical element comprises phase regions across a surface of the at least one optical element, the phase regions configured to provide the phase variation to the different parts of the wavefront of the first beam.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An apparatus for increasing a pulse length of a pulsed radiation beam, the apparatus comprising:
    a beam splitter configured to split an input radiation beam into a first beam and a second beam;
    an optical arrangement, wherein the beam splitter and the optical arrangement are configured such that multiple portions of the first beam are recombined with the second beam into a modified beam after an optical delay of the multiple portions of the first beam caused by the optical arrangement; and
    at least one two-dimensional optical element disposed in an optical path of the first beam, the at least one two-dimensional optical element comprising phase regions across a surface of the at least one two-dimensional optical element,
    wherein the at least one two-dimensional optical element is configured such that an angle at which the radiation is diffracted from the at least one two-dimensional optical element is less than a fraction of an acceptance angle of the radiation in an optical column, the fraction being the reciprocal of the number of the multiple portions of the first beams that substantially contribute to the transmitted intensity of the modified beam, and
    wherein the at least one two-dimensional optical element is configured to actively change the phase regions to randomly change a phase variation of different parts of a diameter of a wavefront of the multiple portions of the first beam to reduce coherence between the multiple portions of the first beam and the second beam.

2. The apparatus of claim 1, wherein the phase regions have heights that vary across the surface of the at least one two-dimensional optical element to provide the phase variation to the different parts of the wavefront of the first beam.

3. The apparatus of claim 1, wherein the at least one two-dimensional optical element is configured such that a pitch of the at least one two-dimensional optical element is less than a spatial coherence length of the input radiation beam.

4. The apparatus of claim 1, wherein the at least one two-dimensional optical element is configured such that a pitch of the at least one two-dimensional optical element is non-commensurate with a spatial coherence length of the input radiation beam.

5. The apparatus of claim 1, wherein the at least one two-dimensional optical element is a transmissive optical element that is configured such that a phase of the different parts of the wavefront of the first beam is varied after transmission through the transmissive optical element.

6. The apparatus of claim 5, wherein the at least one two-dimensional optical element comprises at least one of an electro-optical material and a magneto-optical material.

7. The apparatus of claim 1, wherein the at least one two-dimensional optical element is a reflective optical element that is configured such that a phase of the different parts of the wavefront of the first beam is varied after reflection from the reflective optical element.

8. The apparatus of claim 7, wherein the beam splitter comprises the reflective optical element.

9. The apparatus of claim 1, wherein the at least one two-dimensional optical arrangement is a con-focal resonator including a first con-focal mirror and a second con-focal mirror.

10. The apparatus of claim 1, wherein the apparatus is located in or at an exit of at least one of a laser, an excimer laser, a solid state laser, a solid state oscillator, a master oscillator, a power amplifier, a master oscillator power amplifier, a power oscillator, a master oscillator power oscillator, and a hybrid laser.

11. The apparatus of claim 10, wherein the apparatus is located between at least one of the master oscillator and the power amplifier, the master oscillator and the power oscillator, the solid state oscillator and the power amplifier, and the solid state oscillator and the power oscillator.

12. A lithographic apparatus comprising the apparatus of claim 1.

13. A method for increasing a pulse length of a pulsed radiation beam using an apparatus, the method comprising:
    passing an input radiation beam through a beam splitter of the apparatus to split the input radiation beam into a first beam and a second beam;
    passing the first beam through an optical arrangement of the apparatus, wherein the beam splitter and the optical arrangement are configured such that multiple portions of the first beam are recombined with the second beam into a modified beam after an optical delay of the multiple portions of the first beam caused by the optical arrangement;
    disposing at least one two-dimensional optical element in an optical path of the first beam, the at least one two-dimensional optical element comprising phase regions across a surface of the at least one two-dimensional optical element, wherein the at least one two-dimensional optical element is configured such that an angle at which the radiation is diffracted from the at least one two-dimensional optical element is less than a fraction of an acceptance angle of the radiation in an optical column, the fraction being the reciprocal of the number of the multiple portions of the first beams that substantially contribute to the transmitted intensity of the modified beam, and randomly varying a phase of different parts of a wavefront of a diameter of the first beam to reduce coherence between the first beam and the second beam.

* * * * *